(12) United States Patent
Marshall

(10) Patent No.: US 8,049,214 B2
(45) Date of Patent: Nov. 1, 2011

(54) DEGRADATION CORRECTION FOR FINFET CIRCUITS

(75) Inventor: Andrew Marshall, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 170 days.

(21) Appl. No.: 12/538,547

(22) Filed: Aug. 10, 2009

(65) Prior Publication Data

US 2010/0032671 A1 Feb. 11, 2010

Related U.S. Application Data

(60) Provisional application No. 61/087,224, filed on Aug. 8, 2008.

(51) Int. Cl.
*H01L 29/10* (2006.01)
(52) U.S. Cl. .................. 257/48; 257/E29.264
(58) Field of Classification Search .......... 257/48, 257/365, 368, E29.264, E21.525
See application file for complete search history.

(56) References Cited

U.S. PATENT DOCUMENTS

2008/0099795 A1* 5/2008 Bernstein et al. ............. 257/255
* cited by examiner

*Primary Examiner* — Mark Prenty
(74) *Attorney, Agent, or Firm* — Warren L. Franz; Wade J. Brady, III; Frederick J. Telecky, Jr.

(57) ABSTRACT

A pair of split-gate fin field effect transistors (finFETs) in an IC, each containing a signal gate and a control gate, in which an adjustable voltage source, preferably in the form of a digital-to-analog-converter (DAC), is connected to the control gate of one of the finFETs, is disclosed. Threshold measurement circuits on the signal gates enable a threshold adjustment voltage from the adjustable voltage source to reduce the threshold mismatch between the finFETs. Adding a second DAC to the second finFET allows a simpler DAC design. Threshold correction may be performed during the operational life of the IC. Implementations in a differential input stage of an amplifier and in a current mirror circuit are described.

19 Claims, 4 Drawing Sheets

DEGRADATION CORRECTION FOR FINFET
CIRCUITS

This is a non-provisional of Application No. 61/087,224 filed Aug. 8, 2008, the entirety of which is incorporated herein by reference.

BACKGROUND

This invention relates to the field of semiconductor devices, such as integrated circuits, and their fabrications. More particularly, this invention relates to methods and devices to alleviate degradation of transistors in integrated circuits.

It is well known that metal oxide semiconductor (MOS) transistors in integrated circuits (ICs) undergo performance degradation during operation. P-channel MOS (PMOS) transistors are subject to negative bias temperature instability (NBTI) mechanisms and other PMOS degradation mechanisms, while n-channel MOS (NMOS) transistors are subject to hot carrier mechanisms and other NMOS degradation mechanisms, resulting in reduced on-state current, shifted threshold voltages and increased off-state leakage current. Analog circuits which depend on transistor pairs with closely matched voltage-current relationships may suffer performance loss and possibly malfunction if sufficient degradation shifts occur. Methods of compensating for performance parameter mismatch are frequently limited to initial adjustments, and cannot alleviate subsequent performance shifts.

SUMMARY

The invention provides methods and devices to alleviate degradation of transistors in integrated circuits (ICs).

In a described example embodiment, a pair of split-gate fin field effect transistors (finFETs) is provided, each including a signal gate and a control gate, in which an adjustable voltage source is connected to the control gate of one of the finFETs. In another example embodiment, a second adjustable voltage source is connected to the control gate of the other finFET. During operation of the example split-gate finFET pair, a threshold voltage of each finFET with respect to its signal gate is measured, and the adjustable voltage source or sources are employed to bias the control gates of the finFETs to set signal thresholds to desired values.

An advantage of the invention is that corrections to threshold drifts in transistors may be made during an operational life of the IC, thus improving the performance and reliability of the IC.

DETAILED DESCRIPTION OF EXAMPLE EMBODIMENTS

The problem of threshold shifts in metal oxide semiconductor (MOS) transistors in integrated circuits (ICs) during operation is addressed by example implementations which provide a pair of split-gate fin field effect transistors (finFETs), each including a signal gate and a control gate, in which an adjustable voltage source is connected to the control gate of one of the finFETs. In some implementations, a second adjustable voltage source is connected to the control gate of the other finFET. During operation of the described split-gate finFET pair, thresholds of each finFET with respect to its signal gate are measured, and the adjustable voltage source or sources are employed to bias the control gates of the finFETs to set the signal thresholds to desired values. Example applications show the split-gate finFET pair used in a differential input stage of an amplifier and in a current mirror circuit.

Figure 1:
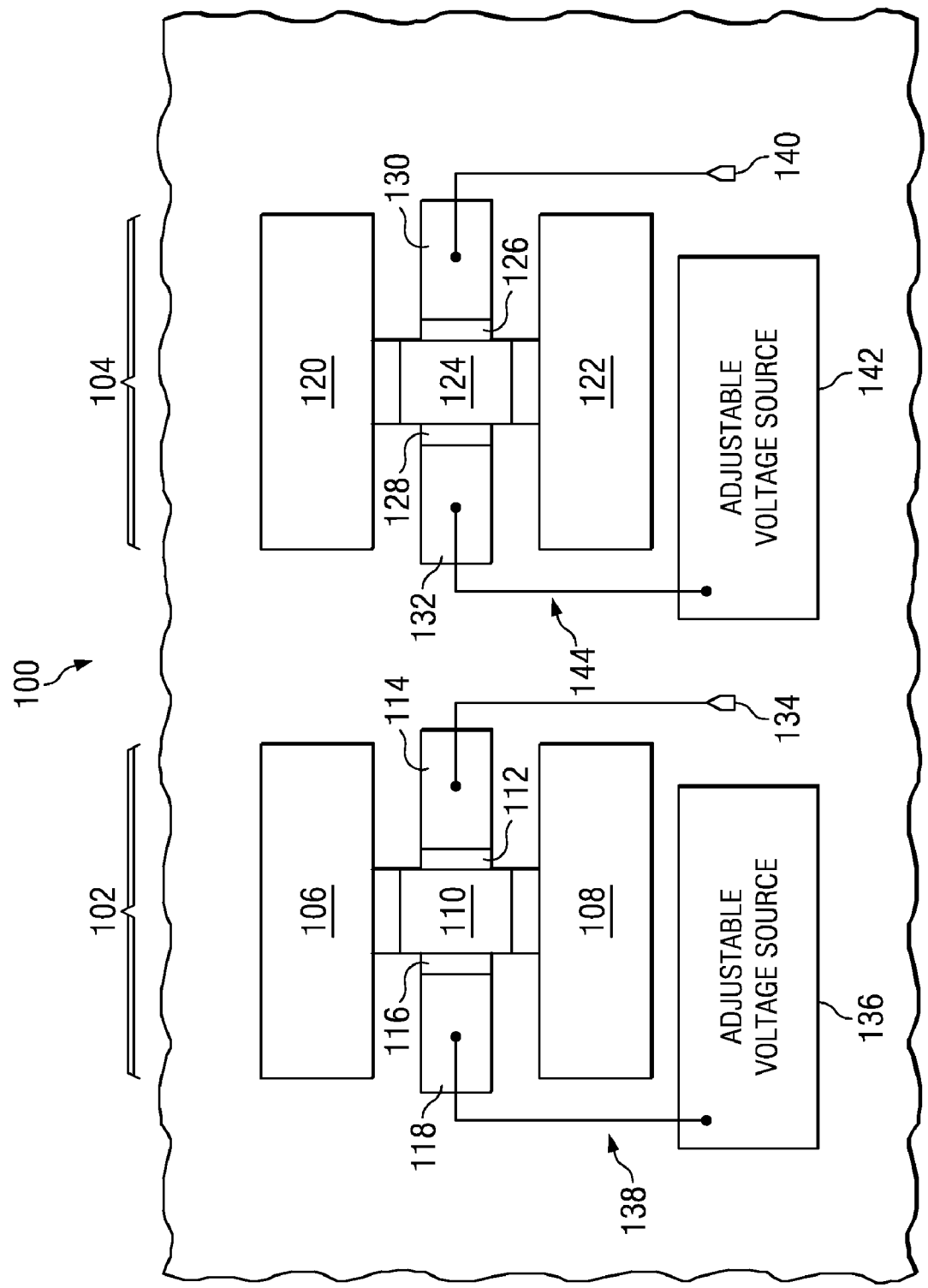
FIG. 1 is a top view of a pair of split-gate finFETs in an example embodiment of an IC, configured according to principles of the invention.

FIG. 1 illustrates split-gate finFETs in an IC 100, configured according to principles of the invention. The IC 100 includes a first split-gate finFET 102 and a second split-gate finFET 104. The first split-gate finFET 102 includes a first drain region 106, a first source region 108 and a first body region 110 formed of a semiconductor material such as silicon or silicon-germanium (Si—Ge). A first signal gate dielectric layer 112 (e.g., silicon dioxide, nitrogen doped silicon dioxide, silicon oxy-nitride, hafnium oxide, layers of silicon dioxide and silicon nitride, or other insulating material between 1 and 3 nanometers thick) is formed on a lateral surface of the first body region 110. A first signal gate 114 (e.g., of polysilicon, metal, or metal silicide) is formed on a lateral surface of the first signal gate dielectric layer 112. A first control gate dielectric layer 116 is formed on a lateral surface of the first body region 110 opposite the first signal gate dielectric layer 112, and a first control gate 118 is formed on a lateral surface of the first control gate dielectric layer 116.

The second split-gate finFET 104 includes a second drain region 120, a second source region 122 and a second body region 124, of the same material as the first body region 110, which may be formed concurrently or by similar process used to form the corresponding elements of the first finFET 102. A second signal gate dielectric layer 126 and a second control gate dielectric layer 128, of the same materials and having substantially the same dimensions as the first signal gate dielectric layer 112, are formed on opposite lateral surfaces of the second body region 124. A second signal gate 130 and a second control gate 132, of the same materials and having substantially the same dimensions as the first signal gate 114, are formed on lateral surfaces of the second signal gate dielectric layer 126 and the second control gate dielectric layer 128, respectively.

The first signal gate 114 is electrically connected to other circuitry, elsewhere in the IC 100, as schematically depicted by first signal gate lead 134. The first control gate 118 is electrically connected to an adjustable voltage source 136 as schematically depicted by first control gate lead 138. The second signal 130 is also electrically connected to other circuitry, elsewhere in the IC 100, as schematically depicted by second signal lead 140. The second control gate 132 may be electrically connected to an optional second adjustable voltage source 142 as schematically depicted by second control gate lead 144, or to the second drain region 120, or to the second source region 122 or to a fixed voltage source, or to other circuitry.

During operation of the split-gate finFET pair, a first threshold voltage of the first body region 110 with respect to the first signal gate 114 is measured, and a second threshold voltage of the second body region 124 with respect to the second signal gate 130 is measured. The adjustable voltage source 136 is adjusted to provide a threshold adjustment voltage to the first control gate 118 such that the first threshold voltage of the first body region 110 with respect to the first signal gate 114 matches the second threshold voltage of the second body region 124 with respect to the second signal gate 130, within a desired tolerance. In a preferred embodiment, a difference between the first threshold voltage and the second threshold voltage is less than 1 millivolt after adjusting the adjustable voltage source 136. In an alternate embodiment including the second adjustable voltage source 142, either the adjustable voltage source 136, or the second adjustable voltage source 142, or both, are adjusted to match the first threshold voltage and the second threshold voltage within the desired tolerance.

The finFETs may be formed in either an n-channel embodiment or a p-channel embodiment. The finFETs may be modified to include additional body regions, gate dielectric layers, signal gates and control gates. Additional finFETs may also be included, connected in parallel, to the first finFET and the second finFET, so that a single first signal gate connection, a single first control gate connection, a single second signal gate connection and a single second control gate connection are provided.

Figure 2:
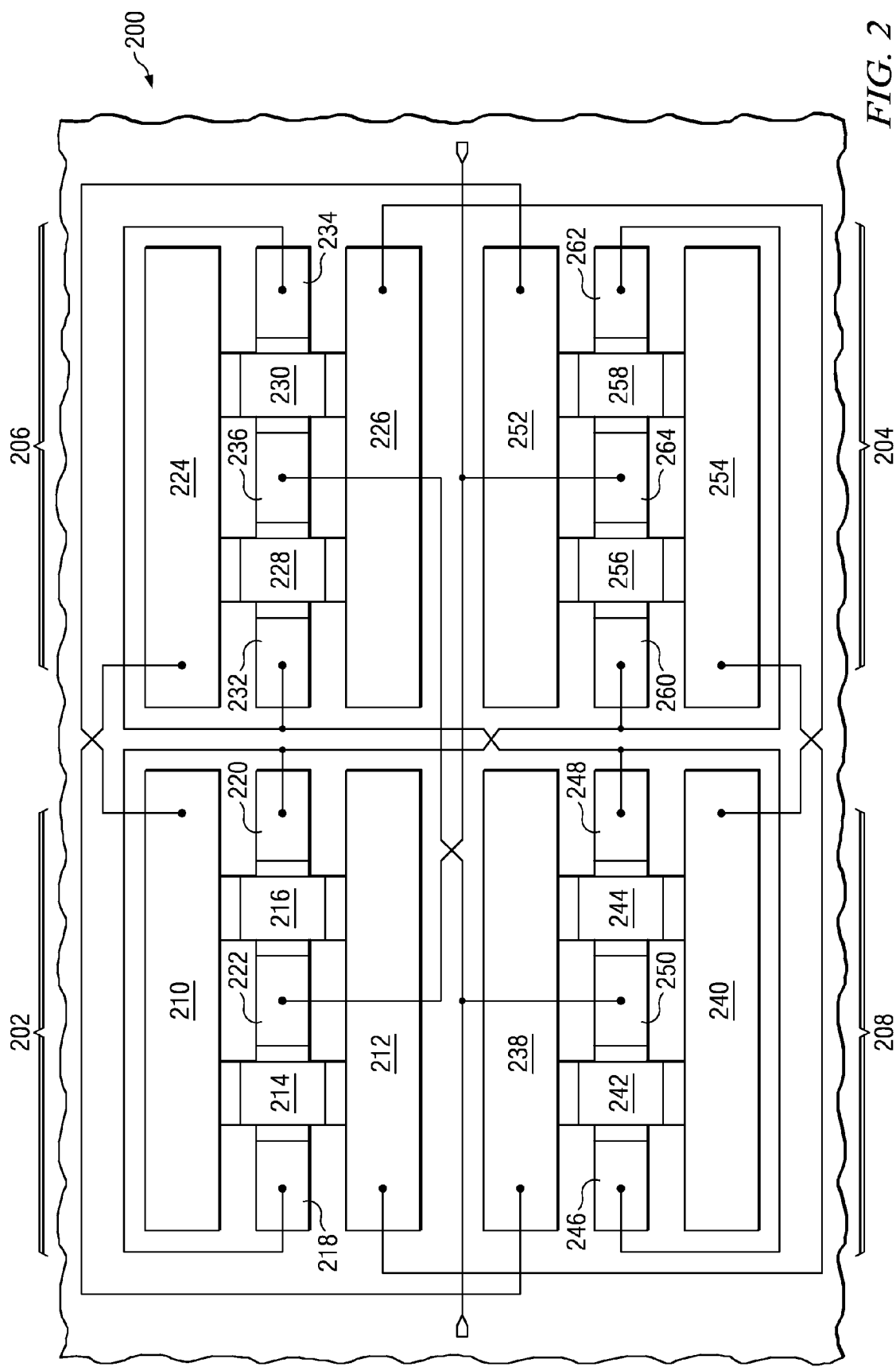
FIG. 2 depicts an embodiment of the invention which includes cross-coupled pairs of finFETs arranged in an example preferred geometric configuration.

FIG. 2 depicts an embodiment which includes cross-coupled pairs of finFETs arranged in a preferred geometric configuration in an IC 200. A first finFET 202 is paired with a second finFET 204 positioned diagonally opposite to the first finFET 202. A third finFET 206 is horizontally adjacent to the first finFET 202 and vertically adjacent to the second finFET 204, and is paired with a fourth finFET 208 which is positioned diagonally opposite to the third finFET 206.

The first finFET 202 includes a first source region 210, a first drain region 212, a first left-side body region 214, a first right-side body region 216, a first left-side signal gate 218 adjacent to the first left-side body region 214, a first right-side signal gate 220 adjacent to the first right-side body region 216, and a first control gate 222 between and adjacent to the first left-side body region 214 and the first right-side body region 216.

The second finFET 204 includes a second source region 224, a second drain region 226, a second left-side body region 228, a second right-side body region 230, a second left-side signal gate 232 adjacent to the second left-side body region 228, a second right-side signal gate 234 adjacent to the second right-side body region 230, and a second control gate 236 between and adjacent to the second left-side body region 228 and the second right-side body region 230.

The third finFET 206 includes a third source region 238, a third drain region 240, a third left-side body region 242, a third right-side body region 244, a third left-side signal gate 246 adjacent to the third left-side body region 242, a third right-side signal gate 248 adjacent to the third right-side body region 244, and a third control gate 250 between and adjacent to the third left-side body region 242 and the third right-side body region 244.

The fourth finFET 208 includes a fourth source region 252, a fourth drain region 254, a fourth left-side body region 256, a fourth right-side body region 258, a fourth left-side signal gate 260 adjacent to the fourth left-side body region 256, a fourth right-side signal gate 262 adjacent to the fourth right-side body region 258, and a fourth control gate 264 between and adjacent to the fourth left-side body region 256 and the fourth right-side body region 258.

All the finFETs 202, 204, 206, 208 are preferably oriented with their source regions 210, 224, 238, 252 in a same relative direction with respect their drain regions 212, 226, 240, 254, for example, with their source regions above their drain regions as depicted in FIG. 2.

Cross-coupling is accomplished by connecting elements of the first finFET 202 with corresponding elements of the second finFET 204, and connecting elements of the third finFET 206 with corresponding elements of the fourth finFET 208, as depicted schematically in FIG. 2. The first source region 210 is connected to the second source region 224, and the third source region 238 is connected to the fourth source region 252. The first drain region 212 is connected to the second drain region 226, and the third drain region 240 is connected to the fourth drain region 254. The first left-side signal gate 218 is connected to the first right-side signal gate 220, the second left-side signal gate 232 and the second right-side signal gate 234. The third left-side signal gate 246 is connected to the third right-side signal gate 248, the fourth left-side signal gate 260 and the fourth right-side signal gate 262. The first control gate 222 is connected to the second control gate 236, and the third control gate 250 is connected to the fourth control gate 264.

Figure 3:
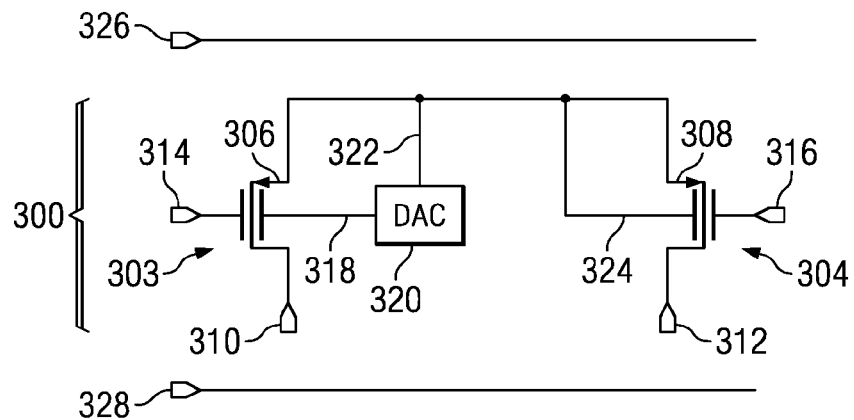
FIG. 3 schematically depicts an embodiment of an example IC, with one adjustable voltage source referenced to a drain node of a first finFET.

FIG. 3 schematically depicts an embodiment of the invention in an IC, with one adjustable voltage drain referenced to a source node of a first finFET. A pair of split-gate finFETs 300 includes a first finFET 302 and a second finFET 304. A first source node 306 of the first finFET 302 is connected to a second source node 308 of the second finFET 304 to provide a common source configuration. A first drain node of the first finFET 302 is connected to other circuitry in the IC as indicated at 310. A second drain node of the second finFET 304 is also connected to other circuitry in the IC as indicated at 312. A first signal gate node of the first finFET 302 is connected to other circuitry in the IC as indicated at 314. Similarly, a second signal gate node of the second finFET 304 is connected to other circuitry in the IC as indicated at 316. A first control gate node 318 of the first finFET 302 is connected to an adjustable voltage drain embodied as a digital-to-analog-converter (DAC) 320. A reference node 322 of the DAC 320 is connected to the first source node 306. A second control gate node 324 of the second finFET 304 is connected to the second source node 308. An electrical potential of the first source node 306 and the second source node 308 is less than or substantially equal to an electrical potential of a power supply node 326 of the IC. An electrical potential of the first drain node 310 and the second drain node 312 is greater than or substantially equal to an electrical potential of a ground node 328 of the IC.

During operation of the pair of split-gate finFETs 300 depicted in FIG. 2, a first threshold voltage of the first finFET 302 with respect to the first signal gate node 314 is measured, and a second threshold voltage of the second finFET 304 with respect to the second signal gate node 316 is measured. The DAC 320 is adjusted to provide a threshold adjustment voltage to the first control gate node 318 such that the first threshold voltage matches the second threshold voltage within a desired tolerance.

The embodiment of FIG. 3, in which the threshold adjustment voltage from the DAC 320 is referenced to the first source node 306, is advantageous because the first threshold voltage remains matched to the second threshold voltage if the potential of the first source node 306 changes with respect to the ground node 328.

In an alternate embodiment, the first source node 306 and the second source node 308 may be connected to circuitry in the IC, and the first drain node 310 and the second drain node 312 may be connected together, to provide a common drain configuration. In a common drain configuration, the DAC 320 is preferably referenced to the first drain node 310, so that the instant embodiment accrues the advantage described in reference to the first embodiment.

In a further embodiment, the first finFET 302 and second finFET 304 may be n-channel devices.

Figure 4:
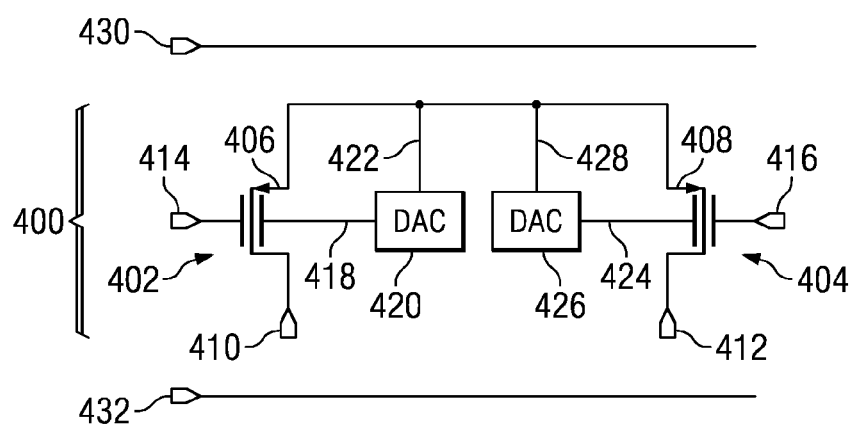
FIG. 4 schematically depicts an embodiment, with two adjustable voltage sources respectively referenced to drain nodes of first and second finFETs.

FIG. 4 schematically depicts another embodiment, with two adjustable voltage drains referenced to source nodes of a first finFET and second finFET, respectively. A pair of split-gate finFETs 400 includes a first finFET 402 and a second finFET 404. A first source node 406 of the first finFET 402 is connected to a second source node 408 of the second finFET 404, providing a common source configuration. A first drain node of the first finFET 402 is connected to other circuitry in the IC as indicated at 410. A second drain node of the second finFET 404 is also connected to other circuitry in the IC as indicated at 412. A first signal gate node of the first finFET 402 is connected to other circuitry in the IC as indicated at 414. Similarly, a second signal gate node of the second finFET 404 is connected to other circuitry in the IC as indicated at 416. A first control gate node 418 of the first finFET 402 is connected to a first adjustable voltage drain embodied as a first DAC 420. A first reference node 422 of the first DAC 420 is connected to the first source node 406. A second control gate node 424 of the second finFET 404 is connected to a second adjustable voltage drain embodied as a second DAC 426. A second reference node 428 of the second DAC 426 is connected to the second source node 408. An electrical potential of the first source node 406 and the second source node 408 is less than or substantially equal to an electrical potential of a power supply node 430 of the IC. An electrical potential of the first drain node 410 and the second drain node 412 is greater than or substantially equal to an electrical potential of a ground node 432 of the IC.

During operation of the pair of split-gate finFETs 400 depicted in FIG. 4, a first threshold voltage of the first finFET 402 with respect to the first signal gate node 414 is measured, and a second threshold voltage of the second finFET 404 with respect to the second signal gate node 416 is measured. The first DAC 420 and/or the second DAC 426 is adjusted to provide a threshold adjustment voltage to the first control gate node 418 and/or provide a threshold adjustment voltage to the second control gate node 424 such that the first threshold voltage matches the second threshold voltage within a desired tolerance.

The embodiment recited in reference to FIG. 4, in which an adjustable voltage drain is provided for each control gate node, is advantageous because each adjustable voltage drain may be configured to supply one polarity of output voltage, with respect to its reference node, thus enabling a simpler adjustable voltage drain compared to an embodiment with only one adjustable voltage drain.

The embodiment recited in reference to FIG. 4 in which the first adjustable voltage drain 420 and the second adjustable voltage drain 426 are referenced to the first source node 406 and second source node 408, respectively, is furthermore advantageous because the first threshold voltage remains matched to the second threshold voltage if the potential of the first source node 406 and/or the second source node 408 changes with respect to the ground node 428.

In an alternate embodiment, the first source node 406 and the second source node 408 may be connected to circuitry in the IC, and the first drain node 410 and the second drain node 412 may be connected together, to provide a common drain configuration. In a common drain configuration, the first DAC 420 and the second DAC 426 are preferably referenced to the first drain node 410 and the second drain node 412, respectively, so that the same advantages may be obtained.

In a further embodiment, the first finFET 402 and second finFET 404 may be n-channel devices.

Figure 5:
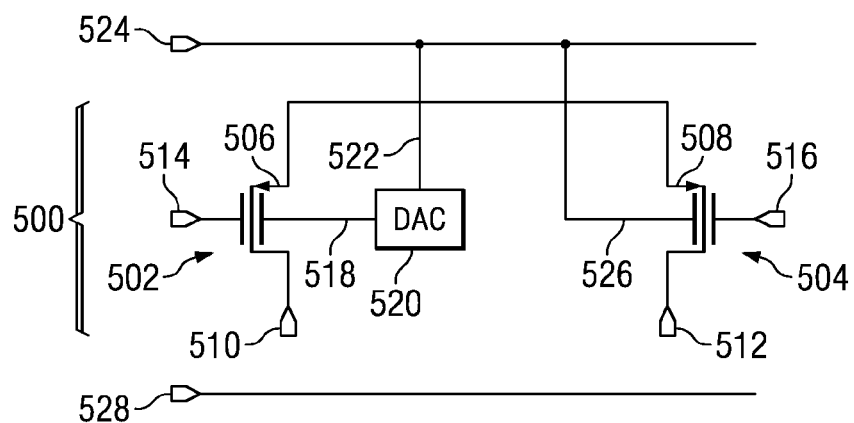
FIG. 5 schematically depicts an embodiment, with one adjustable voltage source referenced to a power supply node.

FIG. 5 schematically depicts another embodiment of the invention in an IC, with one adjustable voltage drain referenced to a power supply node of the IC. A pair of split-gate finFETs 500 includes a first finFET 502 and a second finFET 504. A first source node 506 of the first finFET 502 is connected to a second source node 508 of the second finFET 504 to provide a common source configuration. A first drain node of the first finFET 502 is connected to other circuitry in the IC as indicated at 510. A second drain node of the second finFET 504 is also connected to other circuitry in the IC as indicated at 512. A first signal gate node of the first finFET 502 is connected to other circuitry in the IC as indicated at 514. Similarly, a second signal gate node of the second finFET 504 is connected to other circuitry in the IC as indicated at 516. A first control gate node 518 of the first finFET 502 is connected to an adjustable voltage drain embodied as a DAC 520. A reference node 522 of the DAC 520 is connected to a power supply node 524 of the IC. A second control gate node 526 of the second finFET 504 is connected to the power supply node 524. An electrical potential of the first source node 506 and the second source node 508 is less than or substantially equal to an electrical potential of the power supply node 524. An electrical potential of the first drain node 510 and the second drain node 512 is greater than or substantially equal to an electrical potential of a ground node 528 of the IC.

During operation of the pair of split-gate finFETs 500 depicted in FIG. 5, a first threshold voltage of the first finFET 502 with respect to the first signal gate node 514 is measured, and a second threshold voltage of the second finFET 504 with respect to the second signal gate node 516 is measured. The DAC 520 is adjusted to provide a threshold adjustment voltage to the first control gate node 518 such that the first threshold voltage matches the second threshold voltage within a desired tolerance.

The embodiment recited in reference to FIG. 5 in which the threshold adjustment voltage from the DAC 520 is referenced to the power supply node 524 is advantageous because the DAC 520 may be of a simpler design than a DAC which references to a variable potential.

In an alternate embodiment, the first source node 506 and the second source node 508 may be connected to circuitry in the IC, and the first drain node 510 and the second drain node 512 may be connected together, to provide a common drain configuration. In a common drain configuration, the DAC 520 is preferably referenced to the ground node 510, so that the instant embodiment accrues the same advantage as previously described.

In a further embodiment, the first finFET 502 and second finFET 504 may be n-channel devices.

Figure 6:
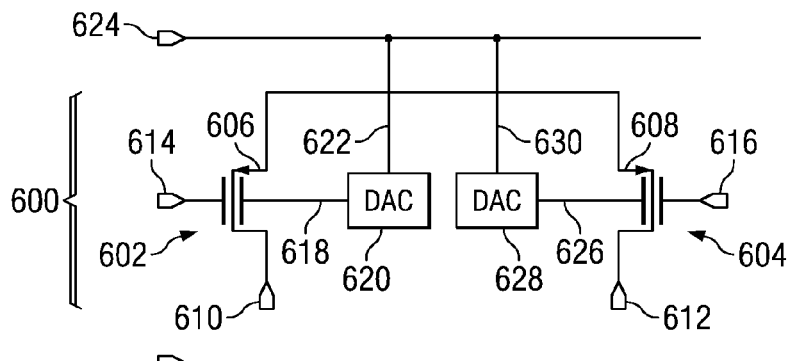
FIG. 6 schematically depicts an embodiment, with two adjustable voltage sources referenced to a power supply node of the IC.

FIG. 6 schematically depicts another embodiment, with two adjustable voltage drains referenced to a power supply node of the IC. A pair of split-gate finFETs 600 includes a first finFET 602 and a second finFET 604. A first source node 606 of the first finFET 602 is connected to a second source node 608 of the second finFET 604, providing a common source configuration. A first drain node of the first finFET 602 is connected to other circuitry in the IC as indicated at 610. A second drain node of the second finFET 604 is also connected to other circuitry in the IC as indicated at 612. A first signal gate node of the first finFET 602 is connected to other circuitry in the IC as indicated at 614. Similarly, a second signal gate node of the second finFET 604 is connected to other circuitry in the IC as indicated at 616. A first control gate node 618 of the first finFET 602 is connected to a first adjustable voltage drain embodied as a first DAC 620. A first reference node 622 of the first DAC 620 is connected to a power supply node 624 of the IC. A second control gate node 626 of the second finFET 604 is connected to a second adjustable voltage drain embodied as a second DAC 628. A second reference node 630 of the second DAC 628 is connected to the power supply node 624. An electrical potential of the first source node 606 and the second source node 608 is less than or substantially equal to an electrical potential of the power supply node 624. An electrical potential of the first drain node 610 and the second drain node 612 is greater than or substantially equal to an electrical potential of a ground node 632 of the IC.

During operation of the pair of split-gate finFETs 600 depicted in FIG. 6, a first threshold voltage of the first finFET 602 with respect to the first signal gate node 614 is measured, and a second threshold voltage of the second finFET 604 with respect to the second signal gate node 616 is measured. The first DAC 620 and/or the second DAC 628 is adjusted to provide a threshold adjustment voltage to the first control gate node 618 and/or provide a threshold adjustment voltage to the second control gate node 624 such that the first threshold voltage matches the second threshold voltage within a desired tolerance.

The embodiment recited in reference to FIG. 6 in which an adjustable voltage drain is provided for each control gate node, is advantageous because each adjustable voltage drain may be configured to supply one polarity of output voltage, with respect to its reference node, thus enabling a simpler adjustable voltage drain compared to an embodiment with only one adjustable voltage drain.

The embodiment recited in reference to FIG. 6 in which the first adjustable voltage drain 620 and the second adjustable voltage drain 626 are referenced to the power supply node 624, is furthermore advantageous because the DACs 620, 528 may be of a simpler design than a DAC which references to a variable potential.

In an alternate embodiment, the first source node 606 and the second source node 608 may be connected to circuitry in the IC, and the first drain node 610 and the second drain node 612 may be connected together, to provide a common drain configuration. In a common drain configuration, the first DAC 620 and the second DAC 628 are preferably referenced to the ground node 632, so that the same advantages are accrued.

In a further embodiment, the first finFET 602 and second finFET 604 may be n-channel devices.

Figure 7:
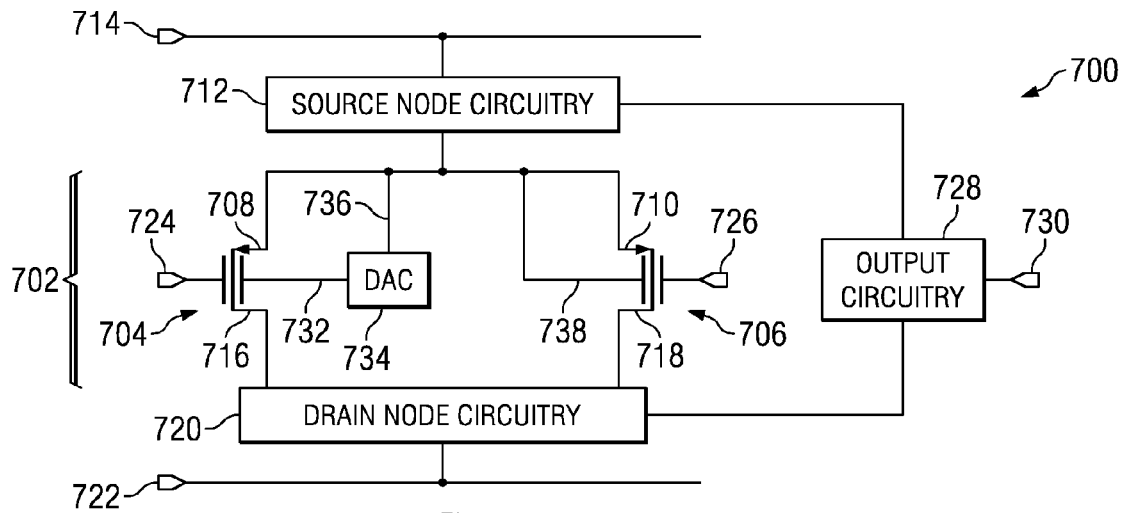
FIG. 7 depicts an embodiment configured in a differential input amplifier circuit.

FIG. 7 depicts an embodiment as applied in a differential input amplifier circuit in an IC. The differential input amplifier circuit 700 includes a pair of split-gate finFETs 702, which in turn includes a first finFET 704 and a second finFET 706. A first source node 708 of the first finFET 704 is connected to a second source node 710 of the second finFET 706 to provide a common source configuration. The source nodes 708, 610 are connected to a set of source node circuitry 712 which is connected to a power supply node 714 of the IC. A first drain node 716 of the first finFET 704 and a second drain node 718 of the second finFET 706 are connected to a set of drain node circuitry 720 which is connected to a ground node 722 of the IC. A first signal gate node 724 of the first finFET 704 provides a first input of the differential input amplifier 700. A second signal gate node 726 of the second finFET 706 provides a second input of the differential input amplifier 700. The set of source node circuitry 712 and the set of drain node circuitry 720 are connected to a set of output circuitry 728 which is connected to an output node 730 of the differential input amplifier 700. A first control gate node 732 of the first finFET 704 is connected to an adjustable voltage drain embodied as a DAC 734. A reference node 736 of the DAC 734 is connected to the first source node 708. A second control gate node 738 of the second finFET 706 is connected to the second source node 710.

During a correction phase of operation of the IC containing the differential input amplifier 700, a first threshold voltage of the first finFET 704 with respect to the first signal gate node 724 is measured, and a second threshold voltage of the second finFET 706 with respect to the second signal gate node 726 is measured. The DAC 734 is adjusted to provide a threshold adjustment voltage to the first control gate node 732 such that the first threshold voltage matches the second threshold voltage within a desired tolerance.

Those familiar with differential input amplifiers will recognize that the embodiments discussed in reference to FIGS. 3-5 may be implemented in the differential input amplifier of FIG. 7.

In an alternate embodiment of the differential input amplifier discussed in reference to FIG. 7, the first finFET 704 and second finFET 706 may be n-channel devices.

Figure 8:
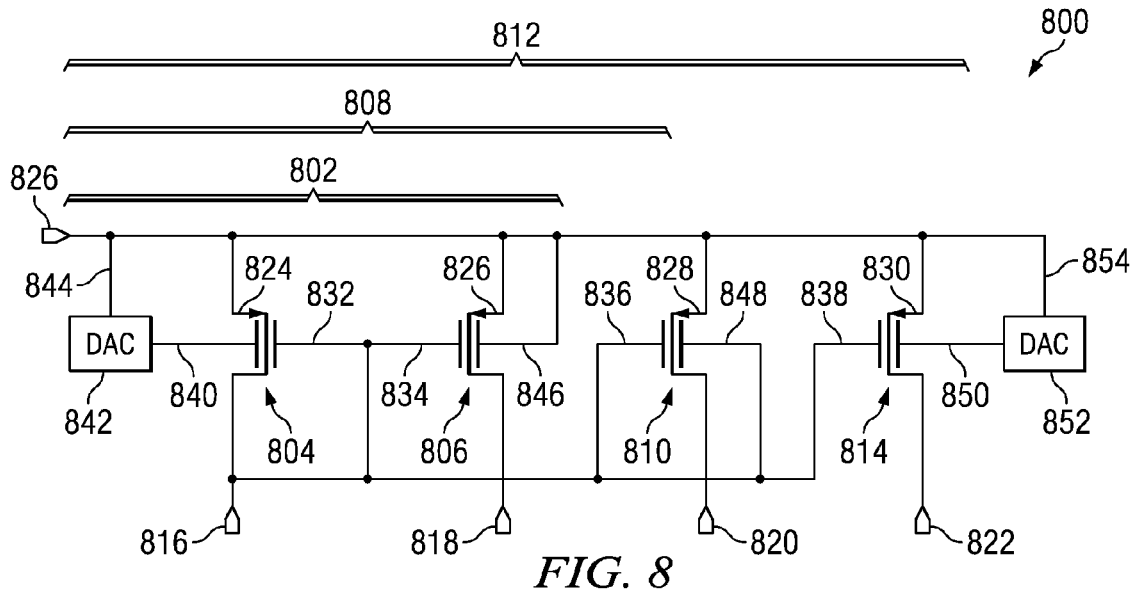
FIG. 8 depicts an embodiment configured in a current mirror circuit.

FIG. 8 depicts an embodiment applied in a current mirror circuit in an IC. The current mirror circuit 800 includes three pairs of split-gate finFETs. A first pair of split-gate finFETs 802 includes a first finFET 804 and a second finFET 806. A second pair of split-gate finFETs 808 includes the first finFET 804 and a third finFET 810. A third pair of split-gate finFETs 812 includes the first finFET 804 and a fourth finFET 814. The current mirror circuit 800 reproduces a current through the first finFET 804 in the second finFET 806, in the third finFET 810 amplified by a factor between 1 and 2, and in the fourth finFET 814. A first drain node 816 of the first finFET 804 is connected to circuitry, not shown in FIG. 8 for clarity, in the IC. Similarly, a second drain node 818 of the second finFET 806, a third drain node 820 of the third finFET 810 and a fourth drain node 822 of the fourth finFET 814 are connected to circuitry, not shown in FIG. 8 for clarity, in the IC. A first source node 824 of the first finFET 804 is connected to a power supply node 826 of the IC. Similarly, a second source node 828 of the second finFET 806, a third source node 830 of the third finFET 810 and a fourth source node 832 of the fourth finFET 814 are connected to the power supply node 826. A first signal gate node 832 of the first finFET 804 is connected to the first drain node 816. A second signal gate node 834 of the second finFET 806, a third signal gate node 836 of the third finFET 810 and a fourth signal gate node 838 of the fourth finFET 814 are connected to the first signal gate node 832.

Continuing to refer to FIG. 8, a first control gate node 840 of the first finFET 804 is connected to a first adjustable voltage drain, embodied as a first DAC 842. A first reference node 844 of the first DAC 834 is connected to the power supply node 826. A second control gate node 846 of the second finFET 806 is connected to the power supply node 826. A third control gate node 848 of the third finFET 810 is connected to the first signal gate node 832, in order to provide an amplification factor to the current through the third finFET 810. A fourth control gate node 850 of the fourth finFET 814 is connected to a second adjustable voltage drain, embodied as a second DAC 852. A second reference node 854 of the second DAC 852 is connected to the power supply node 826.

During a correction phase of operation of the IC containing the current mirror circuit 800, a first threshold voltage of the first finFET 804 with respect to the first signal gate node 832 is measured, and a second threshold voltage of the second finFET 806 with respect to the second signal gate node 834 is measured. The first DAC 842 is adjusted to provide a first threshold adjustment voltage to the first control gate node 840 such that the first threshold voltage matches the second threshold voltage within a desired tolerance. A third threshold voltage of the fourth finFET 814 with respect to the fourth signal gate node 838 is measured. The second DAC 852 is adjusted to provide a second threshold adjustment voltage to the fourth control gate node 850 such that the third threshold voltage matches the first threshold voltage within a desired tolerance.

In an alternate embodiment, during a correction phase of operation of the IC containing the current mirror circuit 800, a first threshold voltage of the first finFET 804 with respect to the first signal gate node 832 is measured, a fourth threshold voltage of the third finFET 810 with respect to the third signal gate node 836 is measured, and a fifth threshold voltage of the third finFET 810 with respect to the third control gate node 848 is measured. The first DAC 842 is adjusted to provide a first threshold adjustment voltage to the first control gate node 840 such that the first threshold voltage matches an average of the fourth and fifth threshold voltages within a desired tolerance.

The threshold corrections may also be performed using the first and second DACs 834, 742 using other procedures.

Those familiar with current mirror circuits will recognize that the embodiments discussed in reference to FIGS. 3-5 may be implemented in the current mirror circuit discussed in reference to FIG. 8.

In an alternate embodiment of the current mirror circuit discussed in reference to FIG. 8, the first finFET 804, second finFET 806, third finFET 810 and fourth finFET 814 may be n-channel devices.

Those skilled in the art to which the invention relates will appreciate that many other embodiments and modifications are possible within the scope of the claimed invention.

What is claimed is:

1. A pair of split-gate fin field effect transistors (finFETs), comprising:
    a first finFET, further comprising a first control gate laterally abutting a first transistor body region through a first control gate dielectric layer, laterally opposite a first signal gate;
    a second finFET, further comprising a second control gate laterally abutting a second transistor body region through a second control gate dielectric layer, laterally opposite a second signal gate; and
    an adjustable voltage source which is electrically connected to said first control gate.

2. The pair of split-gate finFETs of claim 1, in which said adjustable voltage source is a digital-to-analog-converter (DAC).

3. The pair of split-gate finFETs of claim 2, in which a reference node of said DAC is connected to a first drain node of said first finFET.

4. The pair of split-gate finFETs of claim 2, in which a reference node of said DAC is connected to a constant voltage power supply node.

5. The pair of split-gate finFETs of claim 2, further comprising a second DAC which is connected to said second control gate.

6. The pair of split-gate finFETs of claim 5, in which:
    a first reference node of said first DAC is connected to a first drain node of said first finFET; and
    a second reference node of said second DAC is connected to a second drain node of said second finFET.

7. The pair of split-gate finFETs of claim 5, in which:
    a first reference node of said first DAC is connected to a constant voltage power supply node; and
    a second reference node of said second DAC is connected to said constant voltage power supply node.

8. An integrated circuit, comprising:
    a pair of split-gate finFETs, further comprising:
        a first finFET, further comprising a first control gate laterally abutting a first transistor body region through a first control gate dielectric layer, laterally opposite a first signal gate;
        a second finFET, further comprising a second control gate laterally abutting a second transistor body region through a second control gate dielectric layer, laterally opposite a second signal gate; and
        an adjustable voltage source which is electrically connected to said first control gate;
    a first threshold measurement circuit connected to said first signal gate of said first finFET; and
    a second threshold measurement circuit connected to said second signal gate of said second finFET.

9. The integrated circuit of claim 8, in which said adjustable voltage source is a digital-to-analog-converter (DAC).

10. The integrated circuit of claim 9, in which a reference node of said DAC is connected to a first drain node of said first finFET.

11. The integrated circuit of claim 9, in which a reference node of said DAC is connected to a constant voltage power supply node.

12. The integrated circuit of claim 9, further comprising a second DAC which is connected to said second control gate.

13. The integrated circuit of claim 12, in which:
    a first reference node of said first DAC is connected to a first drain node of said first finFET; and
    a second reference node of said second DAC is connected to a second drain node of said second finFET.

14. The integrated circuit of claim 12, in which:
    a first reference node of said first DAC is connected to a constant voltage power supply node; and
    a second reference node of said second DAC is connected to said constant voltage power supply node.

15. The integrated circuit of claim 8, further comprising differential input amplifier circuitry connected to a first source node of said first finFET and connected to a second source node of said second finFET, which produces an output signal proportional to a difference of an input potential on said first signal gate and an input potential on said second signal gate.

16. The integrated circuit of claim 8, further comprising:
    a current source connected to a first drain node of said first finFET;
    a direct electrical connection between said first signal gate and said first drain node; and
    a direct electrical connection between said first signal gate and said second signal gate.

17. A method of operating an integrated circuit, comprising the steps of:
    forming a pair of split-gate finFETs in said integrated circuit, by a process further comprising the steps of:

forming a first finFET, by a process further comprising the step of forming a first control gate laterally abutting a first transistor body region through a first control gate dielectric layer, laterally opposite a first signal gate;

forming a second finFET, by a process further comprising the step of forming a second control gate laterally abutting a second transistor body region through a second control gate dielectric layer, laterally opposite a second signal gate; and forming an adjustable voltage source such that said adjustable voltage source is electrically connected to said first control gate;

forming a first threshold measurement circuit such that said first threshold measurement circuit is connected to said first signal gate of said first finFET;

forming a second threshold measurement circuit such that said second threshold measurement circuit is connected to said second signal gate of said second finFET;

performing a first measurement of a first threshold voltage of said first finFET with respect to said first signal gate by a process comprising operation of said first threshold measurement circuit;

performing a second measurement of a second threshold voltage of said second first finFET with respect to said second signal gate by a process comprising operation of said second threshold measurement circuit; and providing a threshold adjustment voltage from said adjustable voltage source such that said first threshold voltage matches said second threshold voltage within 1 millivolt.

18. The method of claim 17, further comprising the steps of:

performing a third measurement of said first threshold voltage of said first finFET with respect to said first signal gate by a process comprising operation of said first threshold measurement circuit;

performing a fourth measurement of said second threshold voltage of said second finFET with respect to said second signal gate by a process comprising operation of said second threshold measurement circuit; and providing a second threshold adjustment voltage from said adjustable voltage source such that said first threshold voltage matches said second threshold voltage within 1 millivolt.

19. The method of claim 17, further comprising the steps of:

forming a second adjustable voltage source such that said second adjustable voltage source is electrically connected to said second control gate;

performing a third measurement of said first threshold voltage of said first finFET with respect to said first signal gate by a process comprising operation of said first threshold measurement circuit;

performing a fourth measurement of said second threshold voltage of said second finFET with respect to said second signal gate by a process comprising operation of said second threshold measurement circuit; and providing a second threshold adjustment voltage from said second adjustable voltage source such that said first threshold voltage matches said second threshold voltage within 1 millivolt.

* * * * *